(12) United States Patent
Mouli

(10) Patent No.: US 8,283,710 B2
(45) Date of Patent: *Oct. 9, 2012

(54) LOW DARK CURRENT IMAGE SENSORS WITH EPITAXIAL SIC AND/OR CARBONATED CHANNELS FOR ARRAY TRANSISTORS

(75) Inventor: Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 138 days.

This patent is subject to a terminal disclaimer.

(21) Appl. No.: 12/153,151

(22) Filed: May 14, 2008

(65) Prior Publication Data

US 2009/0114959 A1 May 7, 2009

Related U.S. Application Data

(63) Continuation of application No. 11/198,292, filed on Aug. 8, 2005, now Pat. No. 7,585,707, which is a continuation of application No. 10/918,454, filed on Aug. 16, 2004, now Pat. No. 7,385,238.

(51) Int. Cl.
*H01L 31/113* (2006.01)
(52) U.S. Cl. ........................ 257/292; 257/291
(58) Field of Classification Search .......... 257/252–254, 257/290–293, E27.133, E27.131; 438/57, 438/73, 144, 145
See application file for complete search history.

(56) References Cited

U.S. PATENT DOCUMENTS

| | | | |
|---|---|---|---|
| 5,453,611 A | 9/1995 | Oozu et al. | |
| 6,031,263 A | 2/2000 | Forbes et al. | |
| 6,166,405 A | 12/2000 | Kuriyama et al. | |
| 6,171,882 B1 | 1/2001 | Chen et al. | |
| 6,177,333 B1 | 1/2001 | Rhodes | |
| 6,204,524 B1 | 3/2001 | Rhodes | |
| 6,232,626 B1 | 5/2001 | Rhodes | |
| 6,376,868 B1 | 4/2002 | Rhodes | |
| 6,504,193 B1 | 1/2003 | Ishiwata et al. | |
| 6,853,044 B1 | 2/2005 | Chung et al. | |
| 7,385,238 B2* | 6/2008 | Mouli | ............ 257/292 |
| 2002/0063302 A1 | 5/2002 | Furumiya et al. | |
| 2002/0197758 A1 | 12/2002 | Chen et al. | |

FOREIGN PATENT DOCUMENTS

| | | |
|---|---|---|
| EP | 0428050 | 5/1991 |
| JP | 62152184 | 7/1987 |
| JP | 63133666 A * | 6/1988 |

OTHER PUBLICATIONS

T. Ernst et al., "A new SI:C epitaxial channel nMOSFET architecture with improved drivability and short-channel characteristics," 2003 Symposium on VLSI Technology Digest of Technical Papers; pp. 51-52.

(Continued)

*Primary Examiner* — Daniel Whalen
(74) *Attorney, Agent, or Firm* — Dickstein Shapiro LLP

(57) ABSTRACT

A pixel cell having a substrate with a isolation channel formed of higher carbon concentrate such as SiC or carbonated silicon. The channel comprising SiC or carbonated silicon is provided over the substrate of the pixel cell to reduce the dark current leakage.

20 Claims, 12 Drawing Sheets

OTHER PUBLICATIONS

M. Eickhoff et al., "Selective growth of high-quality 3C-SiC using a SiO2 sacrificial-layer technique," Thin Solid Films 345 (1999) pp. 197-199.

T. Ernst, et al., "Fabrication of a novel strained SiGe:C-channel planar 55nm nMOSFET for High-Performance CMOS," 2002 Symposium on VLSI Technology Digest of Technical Papers, pp. 92-93.

Naoki Kubo et al., "Growth of SiC films using tetraethylsilane," ICSRM (International Conference on SiC and Related Materials), Oct. 10-15, 2003 Lyon France (with abstract).

Fatme Abdou et al., "Comparison of different metal additive to Si for the homeopitaxial growth of 4H-SiC layers by Vapour-Liquid-Solid mechanism," ICSRM (International Conference on SiC and Related Materials), Oct. 10-15, 2003 Lyon France (with abstract).

M.J. Hernandez et al., "Low temperature ECR-PECVD microcrystalline SiC growth by pulsed gas flows," ICSRM (International Conference on SiC and Related Materials), Oct. 10-15, 2003 Lyon France (with abstract).

T. Chassagne et al., "Investigation of 2 inch 3C-SiC layers grown in a resistively-heated LP-CVD reactor with horizontal 'hot-walls'," ICSRM (International Conference on SiC and Related Materials), Oct. 10-15, 2003 Lyon France (with abstract).

* cited by examiner

LOW DARK CURRENT IMAGE SENSORS WITH EPITAXIAL SIC AND/OR CARBONATED CHANNELS FOR ARRAY TRANSISTORS

CROSS REFERENCE TO RELATED APPLICATIONS

The present application is a continuation of U.S. patent application Ser. No. 11/198,292, filed on Aug. 8, 2005, now U.S. Pat. No. 7,585,707 which is a continuation of U.S. patent application Ser. No. 10/918,454, filed on Aug. 16, 2004, now U.S. Pat. No. 7,385,238 the disclosures of which are incorporated by reference in their entirety.

The present invention relates generally to semiconductor devices, and more particularly, to photodiode transistor isolation technology for use in semiconductor devices, including CMOS image sensors.

BACKGROUND OF THE INVENTION

CMOS image sensors are increasingly being used as low cost imaging devices. A CMOS image sensor circuit includes a focal plane array of pixel cells, each one of the cells includes a photogate, photoconductor, or photodiode having an associated charge accumulation region within a substrate for accumulating photo-generated charge. Each pixel cell may include a transistor for transferring charge from the charge accumulation region to a sensing node, and a transistor, for resetting the sensing node to a predetermined charge level prior to charge transference. The pixel cell may also include a source follower transistor for receiving and amplifying charge from the sensing node and an access transistor for controlling the readout of the cell contents from the source follower transistor.

In a CMOS image sensor, the active elements of a pixel cell perform the necessary functions of (1) photon to charge conversion; (2) accumulation of image charge; (3) transfer of charge to the sensing node accompanied by charge amplification; (4) resetting the sensing node to a known state before the transfer of charge to it; (5) selection of a pixel for readout; and (6) output and amplification of a signal representing pixel charge from the sensing node.

CMOS image sensors of the type discussed above are generally known as discussed, for example, in Nixon et al., "256×256 CMOS Active Pixel Sensor Camera-on-a-Chip," IEEE Journal of Solid-State Circuits, Vol. 31(12), pp. 2046-2050 (1996); and Mendis et al., "CMOS Active Pixel Image Sensors," IEEE Transactions on Electron Devices, Vol. 41(3), pp. 452-453 (1994). See also U.S. Pat. Nos. 6,177,333 and 6,204,524, which describe the operation of conventional CMOS image sensors and are assigned to Micron Technology, Inc., the contents of which are incorporated herein by reference.

A schematic diagram of a conventional CMOS pixel cell 10 is shown in FIG. 1. The illustrated CMOS pixel cell 10 is a four transistor (4T) cell. The CMOS pixel cell 10 generally comprises a photo-conversion device 23 for generating and collecting charge generated by light incident on the pixel cell 10, and a transfer transistor 17 for transferring photoelectric charges from the photo-conversion device 23 to a sensing node, typically a floating diffusion region 5. The floating diffusion region 5 is electrically connected to the gate of an output source follower transistor 19. The pixel cell 10 also includes a reset transistor 16 for resetting the floating diffusion region 5 to a predetermined voltage; and a row select transistor 18 for outputting a signal from the source follower transistor 19 to an output terminal in response to an address signal.

FIG. 2 is a cross-sectional view of a portion of the pixel cell 10 of FIG. 1 showing the photo-conversion device 23, transfer transistor 17 and reset transistor 16. The exemplary CMOS pixel cell 10 has a photo-conversion device 23 may be formed as a pinned photodiode. The photodiode 23 has a p-n-p construction comprising a p-type surface layer 22 and an n-type photodiode region 21 within a p-type active layer 11. The photodiode 23 is adjacent to and partially underneath the transfer transistor 17. The reset transistor 16 is on a side of the transfer transistor 17 opposite the photodiode 23. As shown in FIG. 2, the reset transistor 16 includes a source/drain region 2. The floating diffusion region 5 is between the transfer and reset transistors 17, 16.

In the CMOS pixel cell 10 depicted in FIGS. 1 and 2, electrons are generated by light incident on the photo-conversion device 23 and are stored in the n-type photodiode region 21. These charges are transferred to the floating diffusion region 5 by the transfer transistor 17 when the transfer transistor 17 is activated. The source follower transistor 19 produces an output signal from the transferred charges. A maximum output signal is proportional to the number of electrons extracted from the n-type photodiode region 21.

Conventionally, a shallow trench isolation (STI) region 3 adjacent to the charge collection region 21 is used to isolate the pixel cell 10 from other pixel cells and devices of the image sensor. The STI region 3 is typically formed using a conventional STI process. The STI region 3 is typically lined with an oxide liner and filled with a dielectric material. Also, the STI region 3 can include a nitride liner. The nitride liner provides several benefits, including improved corner rounding near the STI region 3 corners, reduced stress adjacent the STI region 3, and reduced leakage for the transfer transistor 17.

A common problem associated with a pixel cell is dark current—the discharge of the pixel cell's capacitance even though there is no light over the pixel. Dark current may be caused by many different factors, including: photodiode junction leakage, leakage along isolation edges, transistor subthreshold leakage, drain induced barrier lower leakage, gate induced drain leakage, trap assisted tunneling, and other pixel defects. The obvious trend in the industry is to scale down the size of transistors in terms of both gate length and gate width (i.e., "scaling"). As devices are increasingly scaled down, dark current effect generally increases.

Therefore, it is desirable to have an improved isolation structure for reducing dark current and fixed pattern noise.

BRIEF SUMMARY OF THE INVENTION

A pixel cell is provided having a substrate with an isolation channel of higher carbon concentrate SiC provided in an exemplary embodiments of the invention. The channel comprising SiC or carbonated silicon is provided above the layer of Si in the substrate of the pixel cell to reduce the leakage of dark current.

BRIEF DESCRIPTION OF THE DRAWINGS

The foregoing and other aspects of the invention will be better understood from the following detailed description of the invention, which is provided in connection with the accompanying drawings, in which.

DETAILED DESCRIPTION OF THE INVENTION

Figure 1:
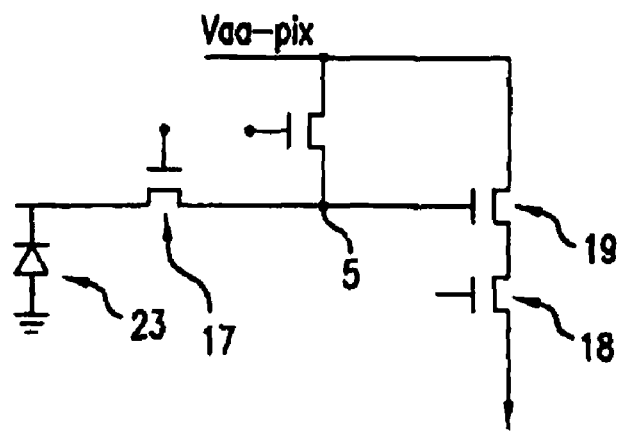
FIG. 1 is a schematic diagram of a conventional pixel cell.

In the following detailed description, reference is made to the accompanying drawings, which form a part hereof and illustrate specific embodiments in which the invention may be practiced. In the drawings, like reference numerals describe substantially similar components throughout the several views. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon, silicon-on-insulator (SOI), silicon-on-sapphire (SOS), and silicon-on-nothing (SON) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium-arsenide.

The term "pixel" or "pixel cell" refers to a picture element unit cell containing a photo-conversion device and transistors for converting electromagnetic radiation to an electrical signal. For purposes of illustration, a portion of a representative pixel cell is illustrated in the figures and description herein and typically fabrication of all pixel cells in an image sensor will proceed concurrently and in a similar fashion.

Figure 2:
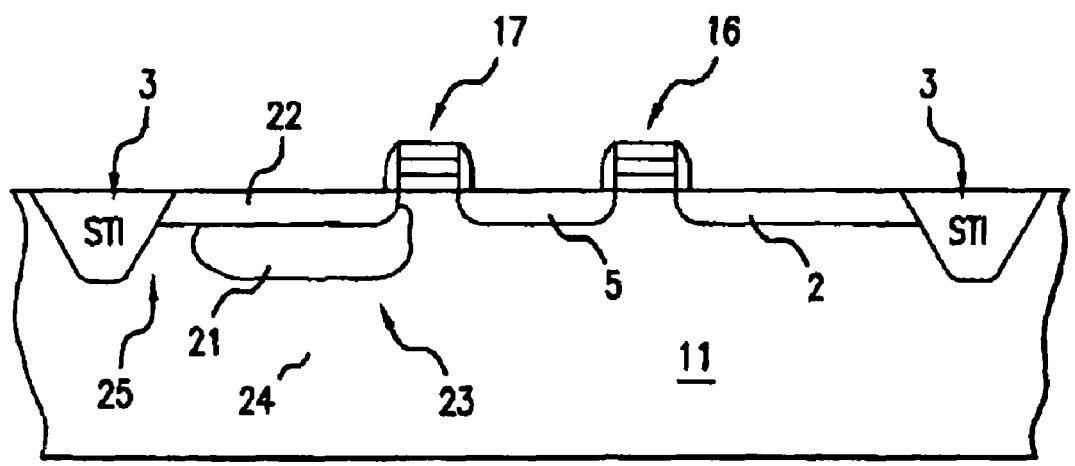
FIG. 2 is a cross-sectional view of a conventional pixel cell.
Figure 3:
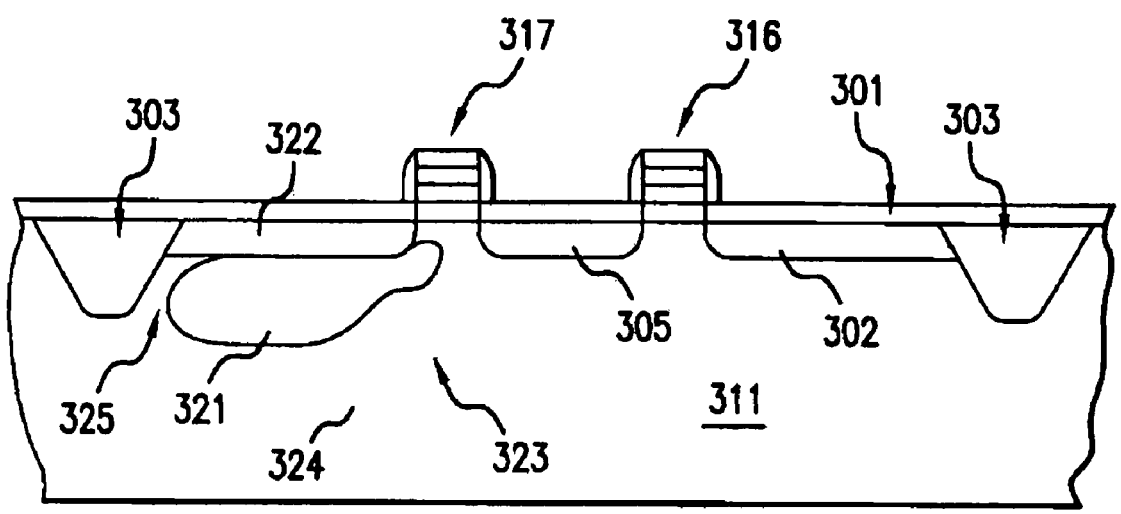
FIG. 3 is a cross-sectional view of a pixel cell in accordance with an exemplary embodiment of the invention.

FIG. 3 is a cross-sectional view of a pixel cell 300 according to an exemplary embodiment of the invention. The pixel cell 300 is similar to the pixel cell 10 depicted in FIGS. 1 and 2, except that the pixel cell 300 includes an isolation channel 301 above the silicon layer 311. The isolation channel 301 is preferably constructed of SiC or channeled carbonated Silicon. The use of a carbon rich layer of material increases the bandgap of the device. Isolation channel 301 has a higher bandgap than Si, typically sixteen (16) orders of magnitude lower than Si, and the resulting pixel cell 300 has a lower intrinsic carrier concentration. Therefore, the isolation channel 301 reduces the dark current level.

Until recently, growing high quality SiC substrates was prohibitively expensive and therefore SiC was used only in selective applications. Recent advances in growing SiC epitaxially have made it less expensive and decreased the defect densities. These advances have made it more possible to use SiC substrates in conventional applications. As the SiC channel can be built or grown on conventional Si layer and as part of a conventional Si process, it can be incorporated in a process that also forms a CMOS photodiode. Recent technological advances in forming the SiC layers can be found, for example, in "A new Si:C epitaxial channel nMosfet Architecture with improved drivability and short-channel characteristics", T. Ernest et al, 2003 *Symposium on VLSI Technology Digest of Technical Papers*, pp. 92-93; "Fabrication of a novel strained SiGe:C-channel planar 55 nm nMosfet for High Performance CMOS", T. Ernest et al, 2002 *Symposium on VLSI Technology Digest of Technical Papers*, pp. 92-93; and "Selective growth of high-quality 3C—SiC using a SiO2 sacrificial layer technique", *Thin Solid Films*, Vol. 345 (2) (1999), pp. 19-99.

The use of SiC or Carbonated Silicon Channels as an isolation channel in a pixel cell reduces dark current levels. Because dark current levels are reduced, the present invention permits greater scaling in the pixel cells arrays. Greater scaling enables a larger fill factor.

The use of SiC or Carbonated Silicon Channels as an isolation channel in a pixel cell also creates additional advantages because of the inherent properties of the materials. Specifically, carbonated silicon materials permit a high temperature operation and enable a pixel cell the ability to sustain high electric fields. Additionally, these materials also have the property of effectively dissipating heat.

FIGS. 4A-4J depict the formation of pixel cell 300 according to an exemplary embodiment of the invention. The steps described herein need not be performed in any particular order, except for those logically requiring the results of prior actions. Accordingly, while the steps below are described as being performed in a general order, the order is exemplary only and can be altered if desired.

Figure 4A:
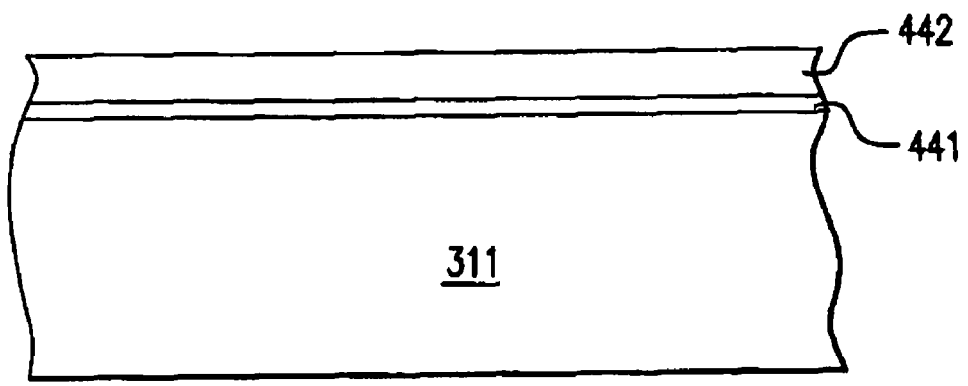
FIG. 4A depicts the pixel cell of FIG. 3 at an initial stage of processing.
Figure 4B:
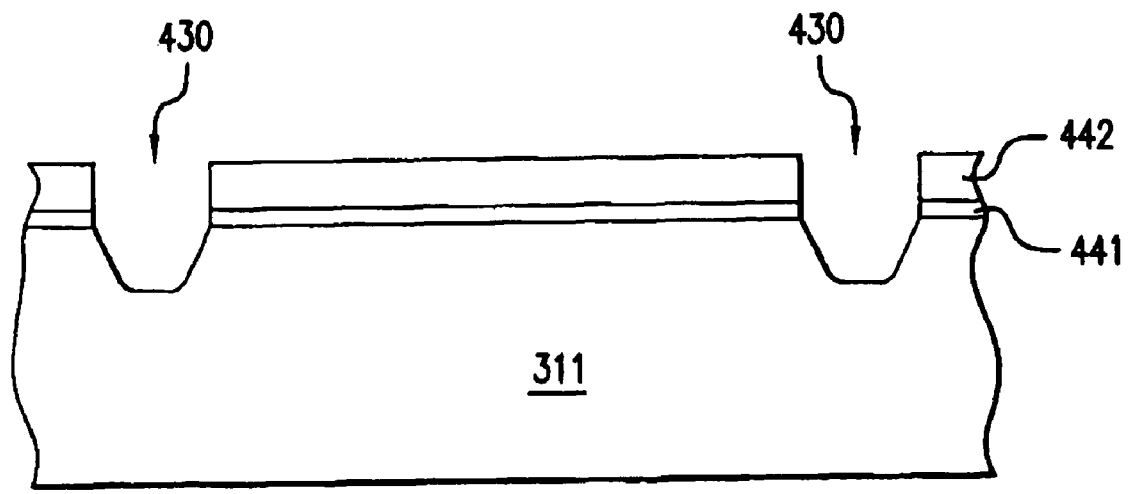
FIGS. 4B-4L depict the pixel cell of FIG. 3 at intermediate stages of processing.

As illustrated in FIG. 4A, a pad oxide layer 441, which can be a thermally grown oxide, is formed on the substrate 311. A sacrificial layer 442 is formed on the pad oxide layer 441. The sacrificial layer 442 can be a nitride or dielectric anti-reflective coating (DARC) layer.

FIG. 4 depicts the formation of a trench 430 in the substrate 11 and through the layers 441, 442 on the substrate 311. The trench 430 can be formed by any known technique. For example, a patterned photoresist layer (not shown) is used as a mask for an etching process. The first etch is conducted utilizing dry plasma conditions and difluoromethane/carbon tetrafluoride ($CH_2F_2/CF_4$) chemistry. Such etching effectively etches both silicon nitride layer 442 and pad oxide layer 441 to form an opening extending therethrough which stops upon reaching the substrate 311. A second etch is conducted to extend the openings into the substrate 311. The second etch is a dry plasma etch utilizing difluoromethane/hydrogen bromide ($CH_2F_2/HBr$) chemistry. The timing of the etch is adjusted to form the trench 430 within substrate 311 to the desired depth. A shorter etch time results in a shallower trench 430. The photoresist mask (not shown) is removed using standard photoresist stripping techniques, preferably by a plasma etch.

Figure 4C:
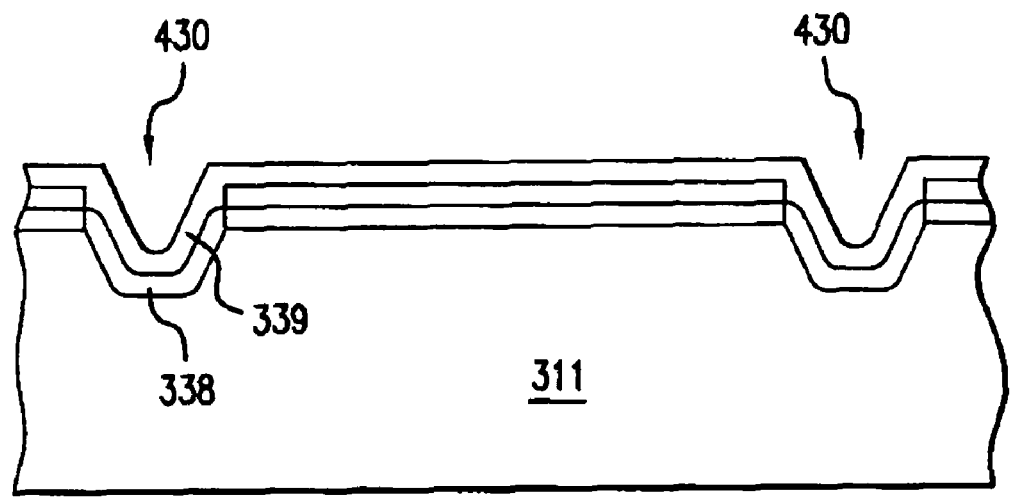
Figure 4D:
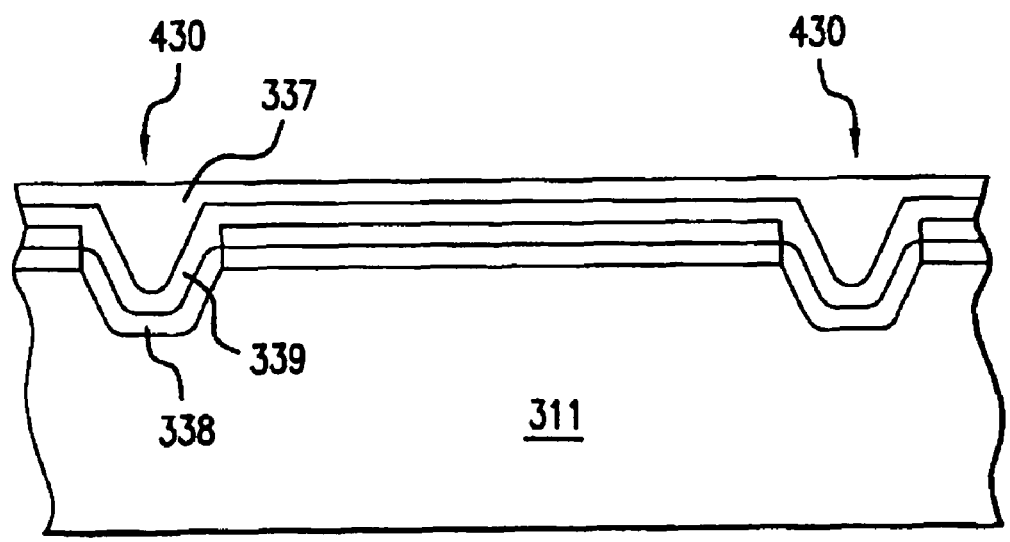

A thin insulator layer 338, between approximately 50 Å and approximately 250 Å thick, is formed on the trench 430 sidewalls and bottom, as shown in FIG. 4C. In the embodiment depicted in FIG. 4C, the insulator layer 338 is an oxide layer 338, which may preferably be grown by thermal oxidization.

The trench 430 can be lined with a barrier film 339. In the embodiment shown in FIG. 4C, the barrier film 339 is a nitride liner, for example, silicon nitride. The nitride liner 339 is formed by any suitable technique, to a thickness within the range of approximately 50 Å to approximately 250 Å. Silicon nitride liner 339 can be formed by depositing ammonia ($NH_3$) and silane ($SiH_4$), as is known in the art.

The trench 430 is filled with a dielectric material 337 as shown in FIG. 4C. The dielectric material 337 may be an oxide material, for example a silicon oxide, such as SiO or silicon dioxide ($SiO_2$); oxynitride; a nitride material, such as silicon nitride; silicon carbide; a high temperature polymer; or other suitable dielectric material. In the illustrated embodiment, the dielectric material 337 is a high density plasma (HDP) oxide.

Figure 4E:
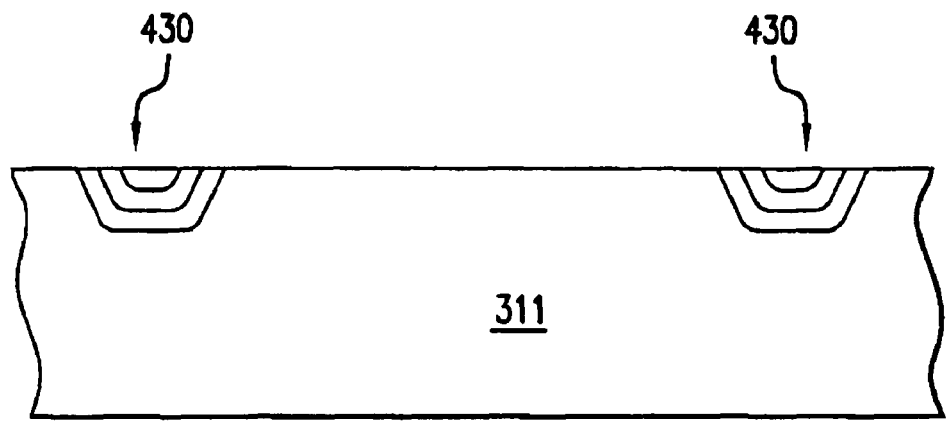

A chemical mechanical polish (CMP) step is conducted to remove the nitride layer 339 over the surface of the substrate 311 outside the trench 430 and the nitride layer 442, as shown in FIG. 4E. Also, the pad oxide layer 441 is removed, for example, using a field wet buffered-oxide etch step and a dean step.

Figure 4F:
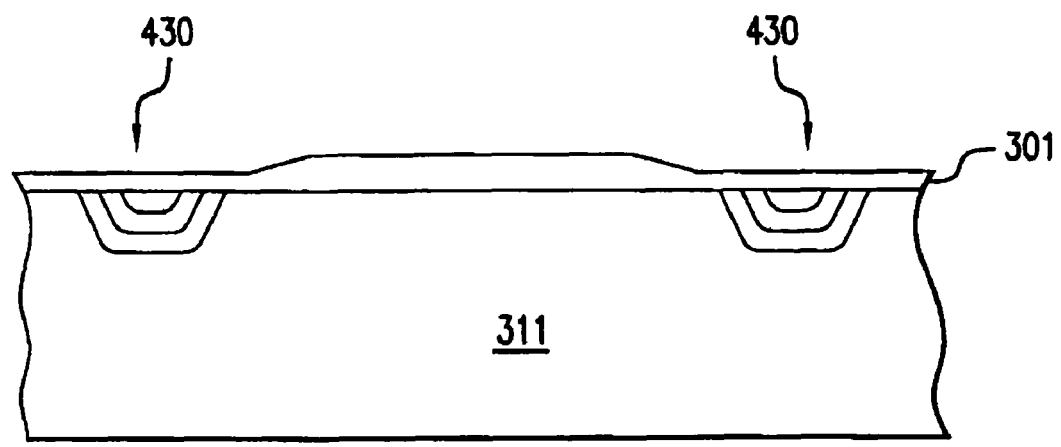

FIG. 4F depicts the formation of isolation channel 301. The epitaxial isolation channel 301 is preferably grown by conventional means (e.g., the method outlined by Ernst, supra.). In a preferred embodiment, the epitaxial channel is grown at a low temperature. The isolation channel 301 in a preferred embodiment is preferably SiC or Carbonated Channel Silicon. The isolation channel 301 need not be grown uniformly; therefore, the depth of the isolation channel 301 over the field regions (e.g., trench 430) may be smaller than the depth of the layer of isolation channel over the non-field regions.

In a preferred embodiment, the carbon concentration is the isolation channel 301 is adjusted. It is known that controlling the temperature at which the Si:C is grown affects the carbon concentration of the isolation channel 301.

Figure 5:
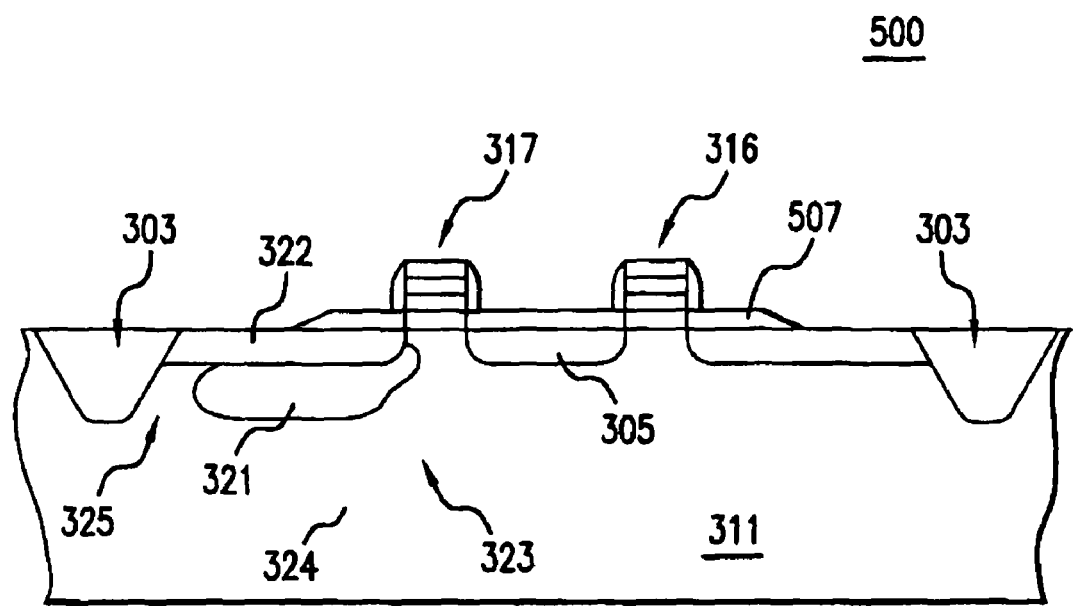
FIG. 5 is a cross-sectional view of a pixel cell according to another exemplary embodiment of the invention.
Figure 6:
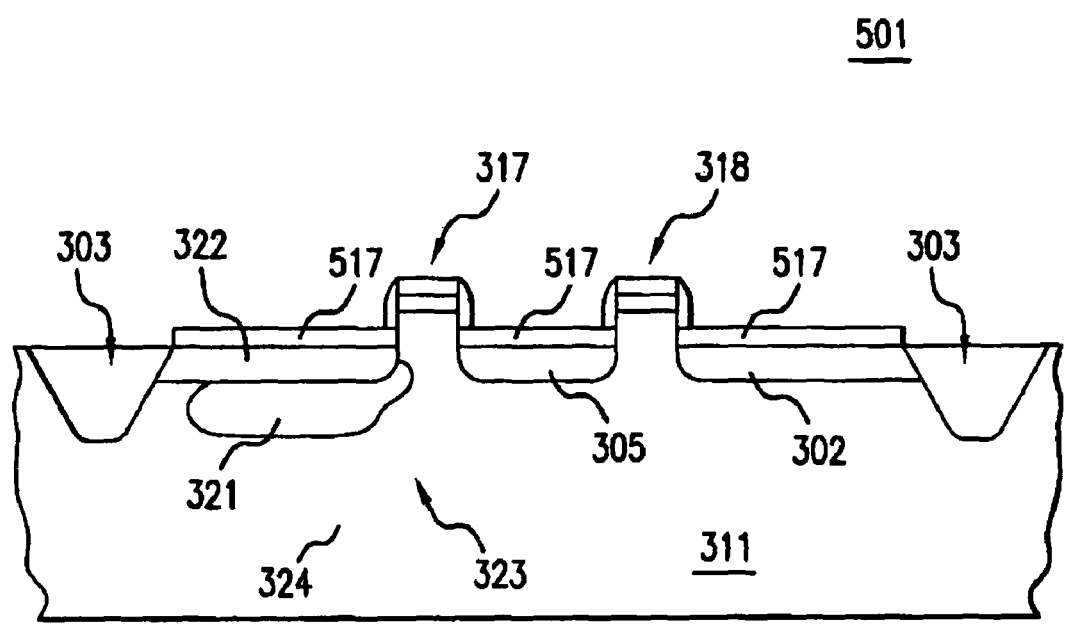
FIG. 6 is a cross-sectional view of a pixel cell according to yet another exemplary embodiment of the invention.

In one embodiment of the invention, the isolation channel is only located in the transistor region. In another embodiment of the invention, the isolation channel is grown over another region of the substrate, e.g., a photo diode region. In yet another embodiment, the isolation channel is grown over the periphery array of the intended cell. In yet another embodiment, the isolation channel is grown over several regions, i.e., combinations of previously mentioned locations, for example, as shown in FIGS. 5 and 6 as described below. Although not shown, a nitride layer is formed prior to the formation of the isolation channel. The nitride deposition is patterned to expose particular areas to the formation of the isolation channel 301 depending on the aspect of the invention.

Figure 4G:
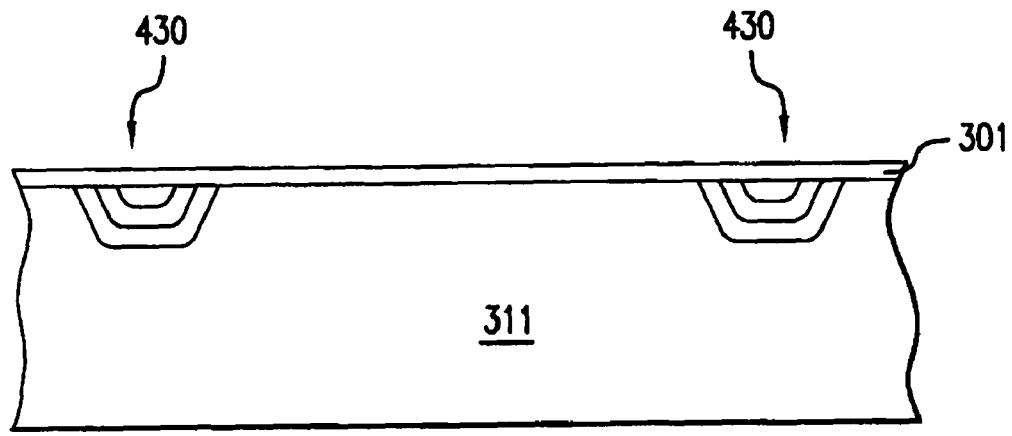

A planarization is conducted on the isolation channel 301, resulting in a relatively uniform height of the layer as seen in FIG. 4G. The layer height can range from 100 Å to 500 Å, where the typical height is approximately 250 Å. In one embodiment of the invention, the height of the isolation channel 301 is approximately 250 Å above the non-field region and the height of the isolation channel 301 is less than approximately 250 Å above the field regions.

Following the planarization step, the nitride layer deposited prior to the formation of the isolation channel 301 is removed by a chemical mechanical polish (CMP) step. The nitride may be selectively removed depending on the embodiment of the invention. For example, in a certain embodiment, it may be desirable not to remove the nitride layer along the periphery of the cell.

Figure 4H:
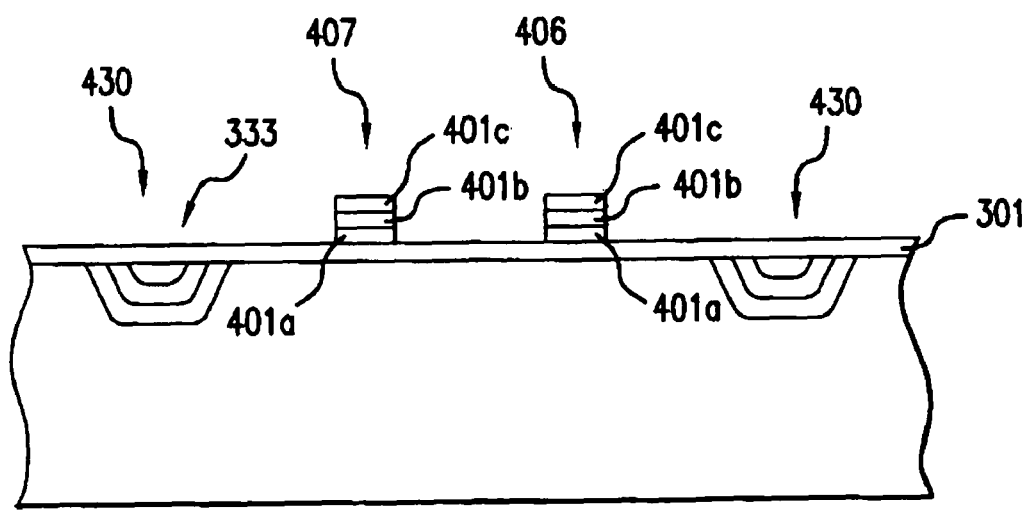

FIG. 4H depicts the formation of the transfer transistor 317 (FIG. 3) gate stack 407 and the reset transistor 316 (FIG. 3) gate stack 406. Although not shown, the source follower and row select transistors 19, 18 (FIG. 1), respectively, can be formed concurrently with the transfer and reset transistors 317, 316 as described below.

To form the transistor gate stacks 407, 406 as shown in FIG. 4H, a first insulating layer 401a of, for example, silicon oxide is grown or deposited on the substrate 311. In a preferred embodiment, the gate oxidation is formed by either rapid thermal oxidation ("RTO") or in-site stem generation (ISSG). The first insulating layer 401a serves as the gate oxide layer for the subsequently formed transistor gate 401b. Next, a layer of conductive material 401b is deposited over the oxide layer 401a. The conductive layer 401b serves as the gate electrode for the transistors 317, 316 (FIG. 3). The conductive layer 401b may be a layer of polysilicon, which may be doped to a second conductivity type, e.g., n-type. A second insulating layer 401c is deposited over the conductive layer 401b. The second insulating layer 401c may be formed of, for example, an oxide ($SiO_2$), a nitride (silicon nitride), an oxynitride (silicon oxynitride), ON (oxide-nitride), NO (nitride-oxide), or ONO (oxide-nitride-oxide).

The gate stack layers 401a, 401b, 401c may be formed by conventional deposition methods, such as chemical vapor deposition (CVD) or plasma enhanced chemical vapor deposition (PECVD), among others. The layers 401a, 401b, 401c are then patterned and etched to form the multilayer gate stacks 407, 406 shown in FIG. 4F.

The invention is not limited to the structure of the gate stacks 407, 406 described above. Additional layers may be added or the gate stacks 407, 406 may be altered as is desired and known in the art. For example, a silicide layer (not shown) may be formed between the gate electrodes 401b and the second insulating layers 401c. The silicide layer may be included in the gate stacks 407, 406, or in all of the transistor gate stack structures in an image sensor circuit, and may be titanium silicide, tungsten silicide, cobalt silicide, molybdenum silicide, or tantalum silicide. This additional conductive layer may also be a barrier layer/refractor metal, such as titanium nitride/tungsten (TiN/W) or tungsten nitride/tungsten ($WN_x/W$), or it could be formed entirely of tungsten nitride ($WN_x$).

Figure 4I:
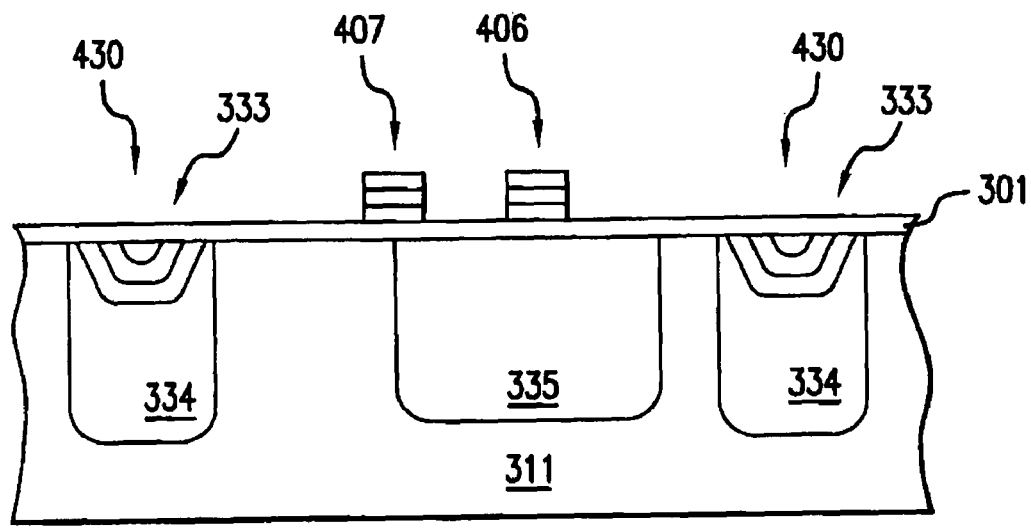

Doped p-type wells 334, 335 are implanted into the substrate 311 as shown in FIG. 4I. The first p-well 334 is formed in the substrate 311 surrounding the isolation region 333 and extending below the isolation region 333. The second p-well 335 is formed in the substrate 311 from a point below the transfer gate stack 407 extending in a direction in the substrate 311 away from where the photodiode 323 (FIG. 3) is to be formed.

The p-wells 334, 335 are formed by known methods. For example, a layer of photoresist (not shown) can be patterned over the substrate 311 having an opening over the area where the p-wells, 334, 335 are to be formed. A p-type dopant, such as boron, can be implanted into the substrate 311 through the opening in the photoresist. The p-wells 334, 335 are formed having a p-type dopant concentration that is higher than adjacent portions of the substrate 311. Alternatively, the p-wells 334, 335 can be formed prior to the formation of the trench 430.

Figure 4J:
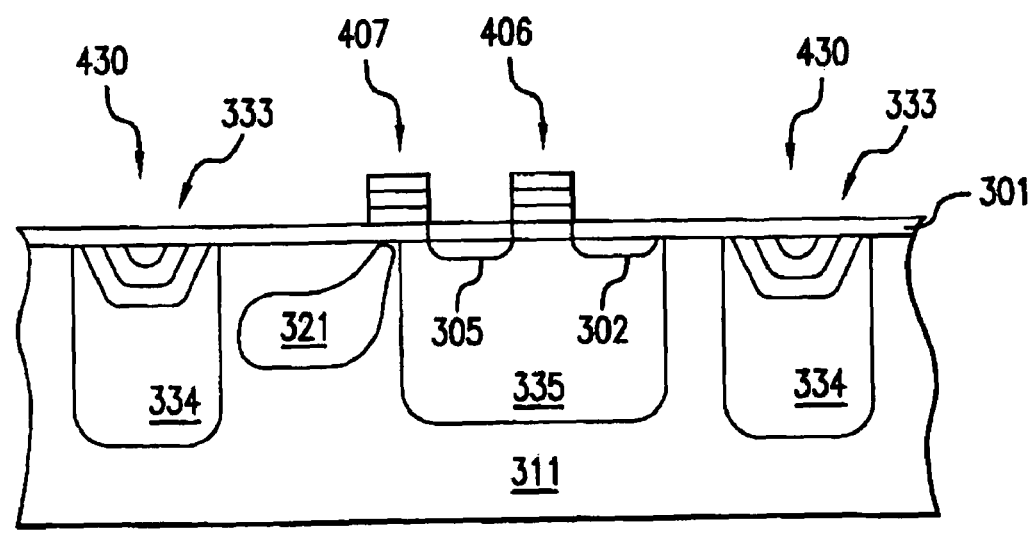

As depicted in FIG. 4J, a doped n-type region 321 is implanted in the substrate 311 (for the photodiode 323 of FIG. 3). For example, a layer of photoresist (not shown) may be patterned over the substrate 311 having an opening over the surface of the substrate 311 where photodiode 323 (FIG. 3) is to be formed. An n-type dopant, such as phosphorus, arsenic, or antimony, may be implanted through the opening and into the substrate 311. Multiple implants may be used to tailor the profile of region 321. If desired, an angled implantation may be conducted to form the doped region 321, whereby the implantation is carried out at angles other than 90 degrees relative to the surface of the substrate 311.

As shown in FIG. 4J, the n-type region 321 is formed from a point adjacent the transfer gate stack 407 and extending in the substrate 311 between the gate stack 407 and the isolation region 333. The region 321 forms a photosensitive charge accumulating region for collecting photo-generated charge.

The floating diffusion region 305 and source/drain region 302 are implanted by known methods to achieve the structure shown in FIG. 4J. The floating diffusion region 305 and source/drain region 302 are formed as n-type regions. Any suitable n-type dopant, such as phosphorus, arsenic, or antimony, may be used. The floating diffusion region 305 is formed on the side of the transfer gate stack 407 opposite the n-type photodiode region 321. The source/drain region 302 is formed on a side of the reset gate stack 406 opposite the floating diffusion region 305.

Figure 4K:
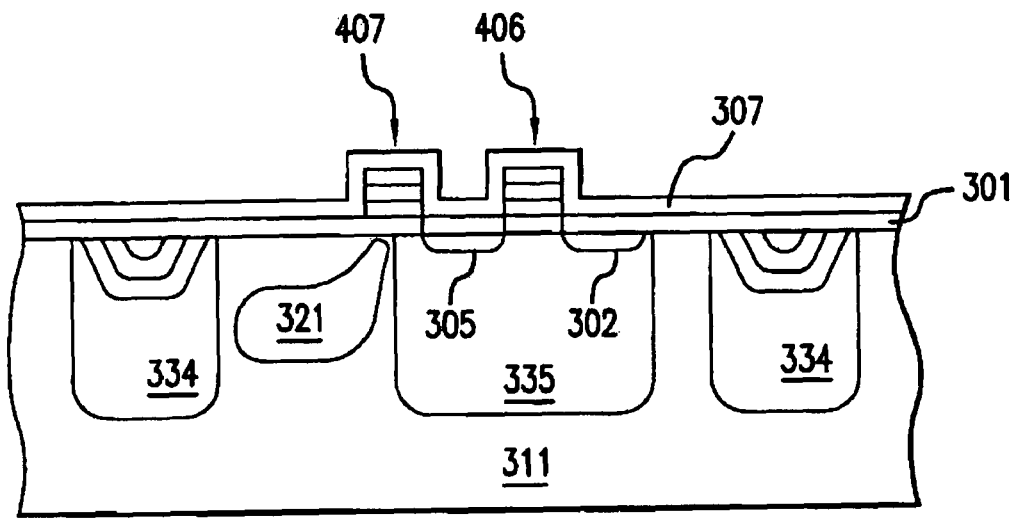

FIG. 4K depicts the formation of a dielectric layer 307. Illustratively, layer 307 is an oxide layer, but layer 307 may be any appropriate dielectric material, such as silicon dioxide, silicon nitride, an oxynitride, or tetraethyl orthosilicate (TEOS), among others, formed by methods known in the art.

Figure 4L:
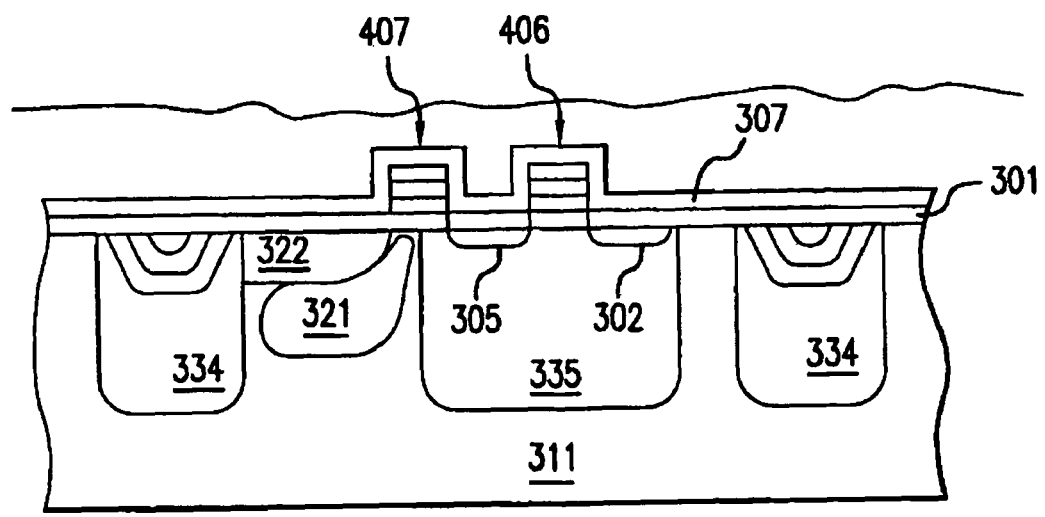

The doped surface layer 322 for the photodiode 323 is implanted, as illustrated in FIG. 4L. Doped surface layer 322 is formed as a highly doped p-type surface layer and is formed to a depth of approximately 0.1 μm. A p-type dopant, such as boron, indium, or any other suitable p-type dopant, may be used to form the p-type surface layer 322.

The p-type surface layer 322 may be formed by known techniques. For example, layer 322 may be formed by implanting p-type ions through openings in a layer of photoresist. Alternatively, layer 322 may be formed by a gas source plasma doping process, or by diffusing a p-type dopant into the substrate 311 from an in-situ doped layer or a doped oxide layer deposited over the area where layer 322 is to be formed.

The oxide layer 307 is etched such that remaining portions form a sidewall spacer on a sidewall of the reset gate stack 406. The layer 307 remains over the transfer gate stack 407, the photodiode 323, the floating diffusion region 305, and a portion of the reset gate stack 406 to achieve the structure shown in FIG. 3. Alternatively, a dry etch step can be conducted to etch portions of the oxide layer 307 such that only sidewall spacers (not shown) remain on the transfer gate stack 407 and the reset gate stack 406.

Conventional processing methods can be used to form other structures of the pixel 300. For example, insulating, shielding, and metallization layers to connect gate lines, and other connections to the pixel 300 may be formed. Also, the entire surface may be covered with a passivation layer (not shown) of, for example, silicon dioxide, borosilicate glass (BSG), phosphosilicate glass (PSG), or borophosphosilicate glass (BPSG), which is CMP planarized and etched to provide contact holes, which are then metallized to provide contacts. Conventional layers of conductors and insulators may also be used to interconnect the structures and to connect pixel 300 to peripheral circuitry.

FIG. 5 depicts a pixel cell 500 in accordance with another exemplary embodiment of the invention. The pixel cell 500 is similar to the pixel cell 300 (FIG. 3) except that isolation channel 507 is only applied to a portion of the image sensor array of pixel cell 500.

FIG. 6 depicts a pixel cell 501 in accordance with another exemplary embodiment of the invention. The pixel cell 501 is similar to the pixel cell 300 (FIG. 3) except that isolation channel 517 is only applied to a portion of the image sensor array of pixel cell 501. In a preferred embodiment, the isolation channel 517 is applied to the source drain regions surrounding the array transistor and on the surface region of the photodiode 323, as seen in FIG. 6.

While the above embodiments are described in connection with the formation of p-n-p-type photodiodes the invention is not limited to these embodiments. The invention also has applicability to other types of photo-conversion devices, such as a photodiode formed from n-p or n-p-n regions in a substrate, a photogate, or a photoconductor. If an n-p-n-type photodiode is formed the dopant and conductivity types of all structures would change accordingly.

Although the above embodiments are described in connection with 4T pixel cell 300, the configuration of pixel cell 300 is only exemplary and the invention may also be incorporated into other pixel circuits having different numbers of transistors. Without being limiting, such a circuit may include a three-transistor (3T) pixel cell, a five-transistor (5T) pixel cell, a six-transistor (6T) pixel cell, and a seven-transistor pixel cell (7T). A 3T cell omits the transfer transistor, but may have a reset transistor adjacent to a photodiode. The 5T, 6T, and 7T pixel cells differ from the 4T pixel cell by the addition of one, two, or three transistors, respectively, such as a shutter transistor, a CMOS photogate transistor, and an anti-blooming transistor. Further, while the above embodiments are described in connection with CMOS pixel cell 300 the invention is also applicable to pixel cells in a charge coupled device (CCD) image sensor.

Figure 7:
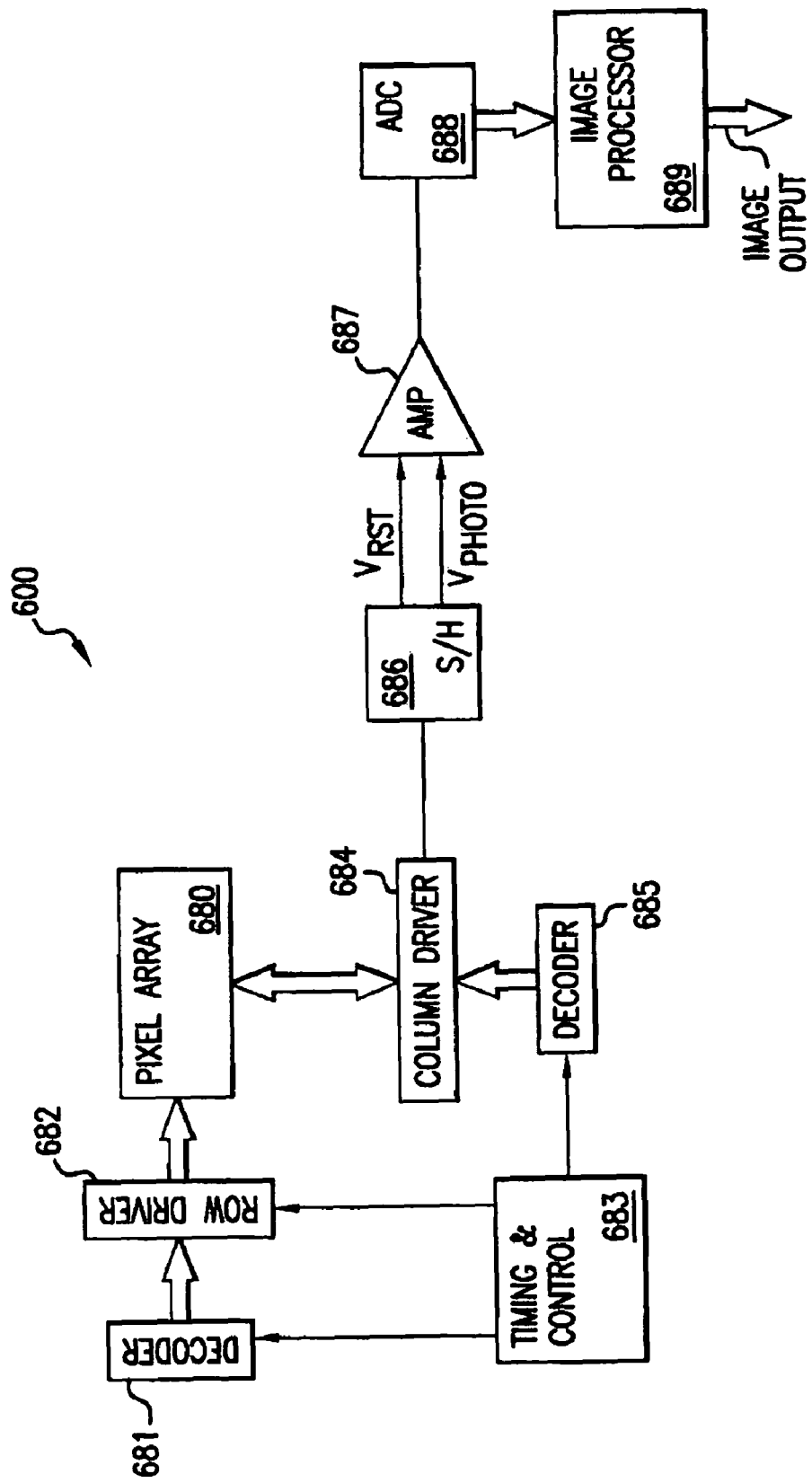
FIG. 7 is a block diagram of a CMOS image sensor according to an exemplary embodiment of the invention.

A typical single chip CMOS image sensor 600 is illustrated by the block diagram of FIG. 7. The image sensor 600 includes a pixel cell array 680 having one or more pixel cell 300, 500, or 501 (FIG. 3, 5, or 6 respectively) described above. The pixel cells of array 680 are arranged in a predetermined number of columns and rows.

The rows of pixel cells in array 680 are read out one by one. Accordingly, pixel cells in a row of array 680 are all selected for readout at the same time by a row select line, and each pixel cell in a selected row provides a signal representative of received light to a readout line for its column. In the array 680, each column also has a select line, and the pixel cells of each column are selectively read out in response to the column select lines.

The row lines in the array 680 are selectively activated by a row driver 682 in response to row address decoder 681. The column select lines are selectively activated by a column driver 684 in response to column address decoder 685. The array 680 is operated by the timing and control circuit 683, which controls address decoders 681, 685 for selecting the appropriate row and column lines for pixel signal readout.

The signals on the column readout lines typically include a pixel reset signal ($V_{rst}$) and a pixel image signal ($V_{photo}$) for each pixel cell. Both signals are read into a sample and hold circuit (S/H) 686 in response to the column driver 684. A differential signal ($V_{rst}$-$V_{photo}$) is produced by differential amplifier (AMP) 687 for each pixel cell, and each pixel cell's differential signal is digitized by analog-to-digital converter (ADC) 688. The analog-to-digital converter 688 supplies the digitized pixel signals to an image processor 689, which performs appropriate image processing before providing digital signals defining an image output.

Figure 8:
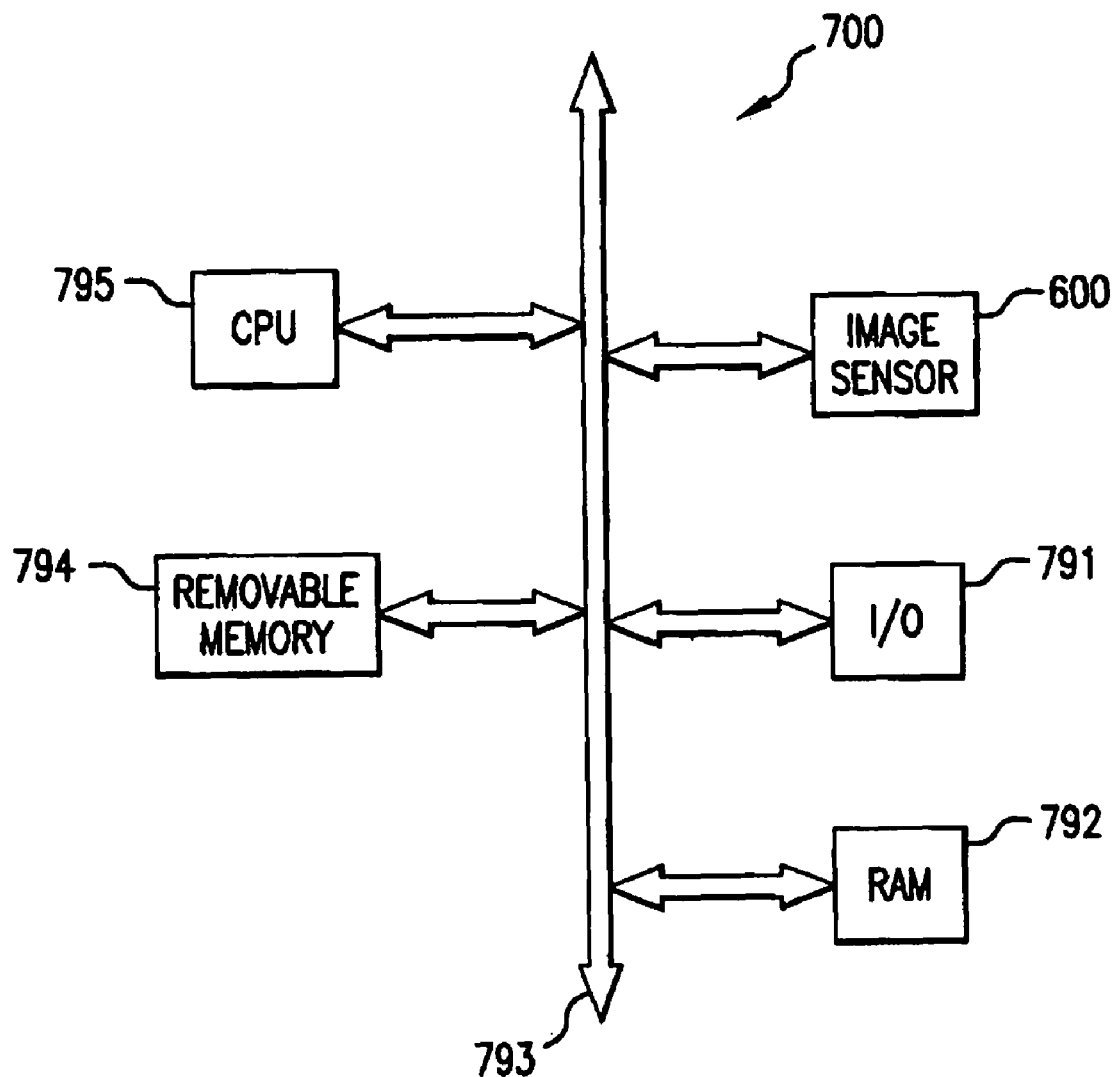
FIG. 8 is a schematic diagram of a computer processor system incorporating the CMOS image sensor of FIG. 3 or 5.

FIG. 8 illustrates a processor-based system 700 including the image sensor 600 of FIG. 7. The processor-based system 700 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, and other systems requiring image acquisition.

The processor-based system 700, for example a camera system, generally comprises a central processing unit (CPU) 795, such as a microprocessor, that communicates with an input/output (I/O) device 791 over a bus 793. Image sensor 600 also communicates with the CPU 795 over bus 793. The processor-based system 700 also includes random access memory (RAM) 792, and can include removable memory 794, such as flash memory, which also communicate with CPU 795 over the bus 793. Image sensor 600 may be combined with a processor, such as a CPU, digital signal processor, or microprocessor, with or without memory storage on a single integrated circuit or on a different chip than the processor.

It is again noted that the above description and drawings are exemplary and illustrate preferred embodiments that achieve the objects, features and advantages of the present invention. It is not intended that the present invention be limited to the illustrated embodiments. Any modification of the present invention which comes within the spirit and scope of the following claims should be considered part of the present invention. For example, although described the exemplary embodiment is described with reference to a CMOS p-n-p pixel cell, the invention is not limited to that structure (e.g., and is applicable to other configurations of pixel cells, both active and passive), nor is the invention limited to that technology (e.g., and is applicable to CCD technology as well).

What is claimed as new and desired to be protected by Letters Patent of the United States is:

1. A pixel cell comprising:
   a substrate having a pixel cell area containing a transistor region and a photo-conversion region;
   a photo-conversion device formed at said photo-conversion region;
   transistors formed at said transistor region;
   a carbon containing conductive isolation material disposed over said substrate at least at said transistor region; and
   a plurality of transistor gate stacks associated with operating transistors of said pixel cell, said gate stacks formed over said isolation material.

2. The pixel cell of claim 1 wherein said substrate comprises Si.

3. The pixel cell of claim 2 wherein said isolation material comprises SiC.

4. A pixel cell comprising:
   a photoconversion device formed on a substrate;
   at least one transistor formed on said substrate for operating said pixel cell and comprising source and drain regions and a channel between said source and drain regions;
   a carbon containing conductive isolation material disposed over said source and drain regions; and
   a transistor gate stack formed over said isolation material and over said channel.

5. The pixel cell of claim 4 wherein said substrate comprises Si.

6. The pixel cell of claim 5 wherein said isolation material comprises SiC.

7. The pixel cell of claim 4 wherein said isolation material comprises Carbonated Silicon.

8. A pixel cell comprising:
   a substrate having a pixel cell area defined by pixel isolation regions;
   a photodiode formed in said pixel cell area;
   an epitaxial carbon containing material provided on said substrate and at least within said pixel cell area; and
   a transistor gate stack provided in said pixel cell area on said carbon containing material,
   wherein said carbon containing material is also provided over said substrate outside said pixel cell area.

9. The pixel cell of claim 8 wherein said carbon containing material is disposed on said substrate.

10. The pixel cell of claim 8 wherein said gate stack is formed on said carbon containing material.

11. The pixel cell of claim 8 wherein said carbon containing material is disposed on said source and drain regions.

12. The pixel cell of claim 8 wherein said transistor is a transfer transistor.

13. The pixel cell of claim 8 wherein said transistor is a reset transistor.

14. A pixel cell comprising:
   a substrate having a pixel cell area;
   a photo-conversion device formed on said substrate in said pixel cell area;
   a carbon containing conductive isolation material having a higher bandgap than said substrate, wherein said carbon containing conductive isolation material is disposed on a periphery portion of said pixel cell area on said substrate and is not disposed on another portion of said pixel cell area; and
   a transistor gate stack formed directly over said carbon containing conductive isolation material.

15. The pixel cell of claim 14, wherein said carbon conductive isolation material has a thickness in a range of approximately 100 Å to 500 Å.

16. The pixel cell of claim 14, wherein said isolation material comprises SiC.

17. The pixel cell of claim 14, wherein said periphery area of said pixel cell area comprises an area of said pixel cell area neighboring said gate stack of said pixel cell.

18. The pixel cell of claim 14, wherein said pixel cell further comprises a photosensitive region formed in said pixel cell area.

19. The pixel cell of claim 14, wherein said carbon containing conductive isolation material comprises an epitaxial layer of isolation material.

20. The pixel cell of claim 14, said substrate further comprising a source and drain area, wherein said carbon containing conductive isolation material is also disposed on at least a portion of said source and drain area.

* * * * *